(12) United States Patent
Kroninger et al.

(10) Patent No.: US 7,988,794 B2
(45) Date of Patent: Aug. 2, 2011

(54) SEMICONDUCTOR DEVICE AND METHOD

(75) Inventors: Werner Kroninger, Regensburg (DE); Josef Schwaiger, Teugn (DE); Ludwig Schneider, Parkstetten (DE); Lukas Ossowski, Villach-Landskron (AT)

(73) Assignee: Infineon Technologies AG, Munich (DE)

( * ) Notice: Subject to any disclaimer, the term of this patent is extended or adjusted under 35 U.S.C. 154(b) by 317 days.

(21) Appl. No.: 11/703,443

(22) Filed: Feb. 7, 2007

(65) Prior Publication Data
US 2008/0185715 A1 Aug. 7, 2008

(51) Int. Cl.
*H01L 23/13* (2006.01)

(52) U.S. Cl. ............ 148/33.3; 257/620; 257/E29.022

(58) Field of Classification Search .......... 438/459, 438/118; 257/E23.004, 620, E29.022; 148/33.3
See application file for complete search history.

(56) References Cited

U.S. PATENT DOCUMENTS

| | | | |
|---|---|---|---|
| 5,885,856 A * | 3/1999 | Gilbert et al. | 438/129 |
| 6,140,178 A * | 10/2000 | Tseng | 438/253 |
| 6,396,158 B1 * | 5/2002 | Travis et al. | 257/784 |
| 6,561,883 B1 * | 5/2003 | Kondo et al. | 451/63 |
| 6,593,226 B2 * | 7/2003 | Travis et al. | 438/626 |
| 6,786,809 B1 * | 9/2004 | Held | 451/288 |
| 6,872,598 B2 | 3/2005 | Liu | |
| 6,905,967 B1 * | 6/2005 | Tian et al. | 438/697 |
| 6,930,023 B2 | 8/2005 | Okada et al. | |
| 7,018,268 B2 * | 3/2006 | Kassir et al. | 451/5 |
| 7,054,052 B2 * | 5/2006 | Niklaus et al. | 359/291 |
| 7,078,771 B2 * | 7/2006 | Kim | 257/351 |
| 7,195,988 B2 * | 3/2007 | Nemoto et al. | 438/459 |
| 7,288,489 B2 * | 10/2007 | Dolechek et al. | 438/745 |
| 2003/0219975 A1 * | 11/2003 | Koutny et al. | 438/637 |
| 2005/0064681 A1 * | 3/2005 | Wood et al. | 438/459 |
| 2005/0221277 A1 * | 10/2005 | Kawanishi | 435/4 |
| 2005/0241929 A1 * | 11/2005 | Auger et al. | 200/512 |
| 2005/0264176 A1 * | 12/2005 | Onozuka et al. | 313/500 |
| 2007/0278605 A1 * | 12/2007 | Shibayama | 257/432 |
| 2008/0087636 A1 * | 4/2008 | Wu et al. | 216/44 |

FOREIGN PATENT DOCUMENTS

EP 1361602 A2 4/2003

* cited by examiner

*Primary Examiner* — George Fourson
(74) *Attorney, Agent, or Firm* — Dicke, Billig & Czaja, P.L.L.C.

(57) ABSTRACT

A semiconductor device having a topology adjustment and a method for adjusting the topology of a semiconductor device. The semiconductor device includes a semiconductor wafer having first and second opposing sides with an active area formed on a first portion of the first side having a topology extending a first distance above the first side. A support member is attached to a second portion of the first side and extending a second distance above the first side, wherein the first distance is about the same as the second distance. In some exemplary embodiments, the support member is formed by applying adhesive to the second portion. The wafer is then spun to adjust the second distance.

9 Claims, 4 Drawing Sheets

SEMICONDUCTOR DEVICE AND METHOD

BACKGROUND

The present disclosure relates generally to semiconductor devices.

With many electronic devices, it is desirable to provide a semiconductor wafer having a thin profile. Typically, thinning a wafer to achieve the desired thickness involves grinding the wafer. A tape is attached to the active area of the wafer to affix the wafer to chuck so that the opposite side of the wafer can be ground until the wafer's thickness is reduced to the desired dimension.

However, the active portion of the wafer having the electronic circuits or other devices formed thereon typically does not cover the entire surface of the wafer. Rather, the active portion covers only the central portion of the wafer, leaving an edge exclusion area about the periphery of the wafer. When the side of the wafer including the active area is affixed to the chuck and the grinder is applied to the opposite side of the wafer, the edge exclusion area is left unsupported.

SUMMARY

In accordance with aspects of the present disclosure, a semiconductor device and a method for producing such a device are provided. The semiconductor device includes a semiconductor wafer having first and second opposing sides with an active area formed on a first portion of the first side having a topology extending a first distance above the first side. A support member is attached to a second portion of the first side and extending a second distance above the first side, wherein the first distance is about the same as the second distance. In certain embodiments, the second portion of the first side defines an edge exclusion area about a periphery of the first side. The support member may provide support to the second portion during grinding processes for thinning the wafer, thus reducing or eliminating damage to the wafer resulting from the grinding process.

In some exemplary embodiments, the support member is formed by applying adhesive to the second portion. The wafer is then spun to adjust the second distance. In embodiments with a circular semiconductor wafer, the active area is formed on a central portion of a first side of the wafer with an edge exclusion area about the periphery of the wafer. The adhesive is dispensed around the edge exclusion area, and the first side of the wafer is attached to a chuck. The wafer is then spun to remove excess adhesive. Tape may be attached to the first side such that the active area and the adhesive are covered by the tape to facilitate attaching the wafer to the chuck. Once the support member is in place, the second side of the wafer can be ground to thin the wafer.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following disclosure, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
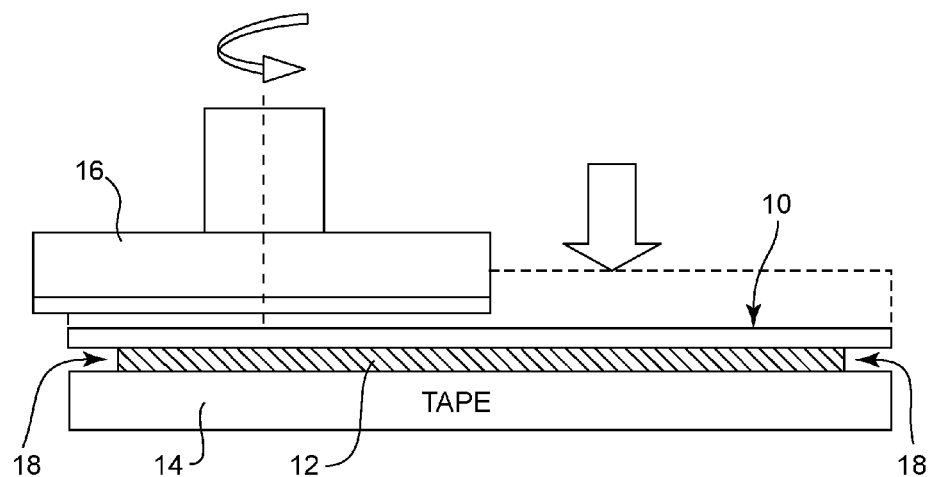
FIG. 1 is a section view illustrating a prior art grinding process for a semiconductor device.

FIG. 1 conceptually illustrates portions of a typical wafer thinning operation. The active area 12 of a semiconductor wafer 10 has tape 14 applied thereto to affix the wafer 10 to a chuck. A grinder 16 is rotated with a downward force on the opposite side of the wafer 10 to grind away the semiconductor material, thereby thinning the wafer 10. As shown in FIG. 1, the edge exclusion area 18 is left unsupported, which often results in chips or cracks in this edge region 18 of the wafer due to the force and vibration of the grinder 16 on the wafer 10.

Figure 2A:
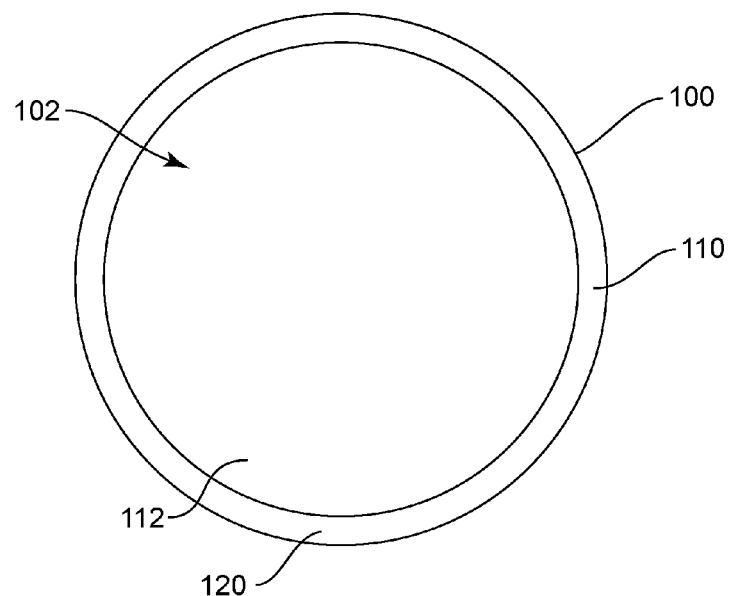
FIGS. 2A and 2B are a top views schematically illustrating alternative embodiments of a semiconductor device in accordance with aspects of the present disclosure.
Figure 2B:
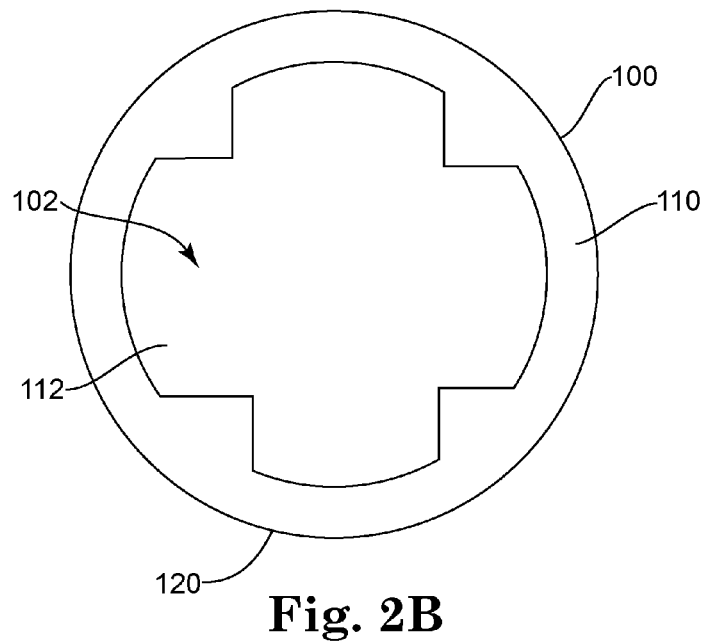
Figure 3:
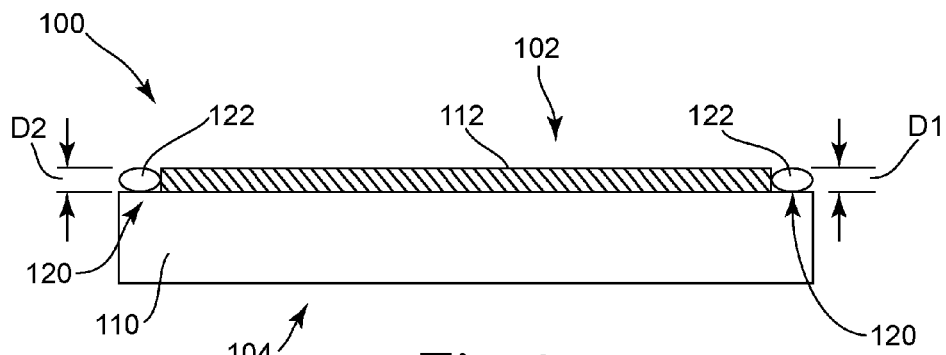
FIG. 3 is a side section view of the semiconductor device shown in FIGS. 2A and 2B.

FIG. 2 is a top view and FIG. 3 is a side sectional view conceptually illustrating portions of a semiconductor device 100 in accordance with aspects of the present disclosure. The device 100 includes a wafer 110 that has first and second (top and bottom as shown in FIG. 3) sides 102, 104 opposite one another. The top side 102 has an active area 112, which typically includes electronic devices such as integrated circuits, though other embodiments are envisioned in which the active area includes other types of devices such as microelectromechanical systems (MEMS). MEMS devices situated in the active area 112 could include pressure or acceleration sensors, for example. The active area 112 defines a topology that extends a first distance D1 above the first side 102.

The active area does not cover the entire top side 102, but rather, covers only a portion thereof. For example, the production process for some types of semiconductor devices requires the active area 112 of the device be excluded from the outer periphery of the wafer 110, resulting in an edge exclusion area 120. As noted in the Background section above, if this edge exclusion area 120 is left unsupported, it is vulnerable to damage caused by grinding the wafer 110 to achieve the desired thickness.

In accordance with aspects of the present disclosure, a support member 122 is provided in that area of the top side 102 of the wafer 110 without the active area formed thereon. In the illustrated embodiment, the support member 122 is attached to the top side 102 in the edge exclusion area 120 comprising the outer periphery of the first side 102. The device 100 shown in FIG. 2A is generally circular, though the device 100 may be formed in other shapes in other embodiments. For example, FIG. 2B shows an alternative embodiment in which the active area 112 consists of an array of rectangular integrated circuits distributed over the wafer (not shown), the outer edge of the active area 112 thus has a stepped shape formed by the sides and corners of the outer integrated circuits on the wafer, instead of a circular shape such as is shown in FIG. 2A. In the embodiment shown in FIG. 2B, a ring-shaped support member 122 is still sufficient to provide the necessary support. In still further embodiments, portions of the top side 102 other than the outer periphery may exclude the active portion 112 and thus, have the support member 122 situated thereon.

Figure 4:
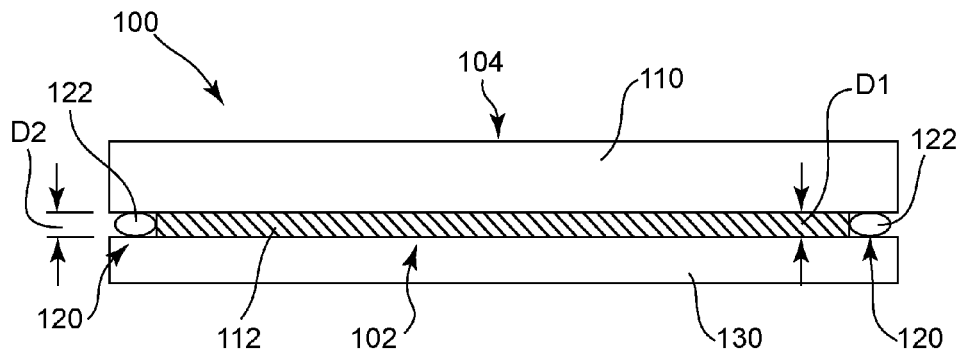
FIG. 4 is a side section view illustrating the device of FIG. 4 inverted with a tape attached to it.
Figure 5:
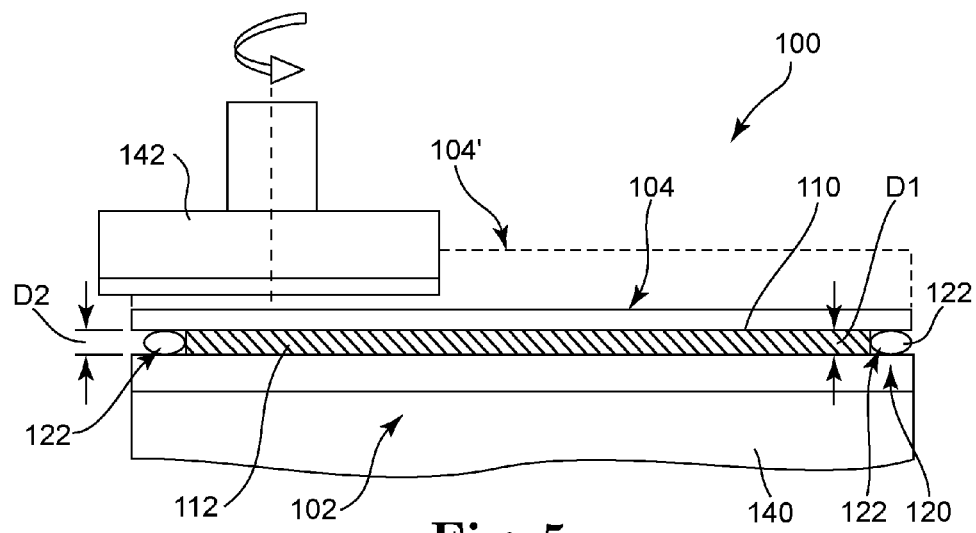
FIG. 5 illustrates portions of a process for thinning the device shown in FIG. 4.

The support member 122 provides a topology adjustment for the active area 112, extending a second distance D2 above the top side 102 and thus balancing the topology of the top side 102 all the way to the edge of the wafer 110 to provide support for the edge exclusion area 120 in the illustrated embodiment. FIGS. 4 and 5 illustrate portions of the wafer thinning process using the support member 122. In FIG. 4, the semiconductor device is shown inverted from the view shown in FIG. 3, and a tape 130 is fastened to the first side 102, including the active area 112 and the support member 122 to facilitate mounting the device 100 on a chuck. The support member 122 is sandwiched between the edge exclusion area 120 and the tape 130.

FIG. 5 shows the device 100 mounted on a chuck 140 via the tape 130. In other embodiments, suitable attachment means other than the tape 130 can be used to attach the device to a chuck. A grinder 142 is rotated on the second side 104 of the wafer 110 to remove the wafer material (removed wafer represented by the dashed line), thus thinning the wafer from its original thickness represented between the original second side 104' and the first side 102, to the thickness shown between the resulting second side 104 and the first side 102.

To be effective, the distance D2 of the support member above the top side 102 should be about the same as the height D1 of the active area 112. If distance D2 is significantly greater than or less than D1, the support member won't properly support the edge exclusion area 120 as the grinder 142 applies vibrations and a downward force to the wafer 110 on the chuck 140. For example, in one exemplary embodiment, the active area 112 extends above the top side 102 about 25-500 µm, and the support member 122 should be within ±10-20% of this dimension.

In certain exemplary embodiments, the support member 122 is fabricated from an adhesive material. The use of such a material allows easy adjustment of the height of the support member 122, and also allows variation in the height of the support member 122 to provide the proper topology adjustment as the height of the active area 112 changes from wafer to wafer due to process variation. Thus, for a round wafer, the support member 122 is produced by a ring of adhesive dispensed about the edge exclusion area 120.

Figure 6:
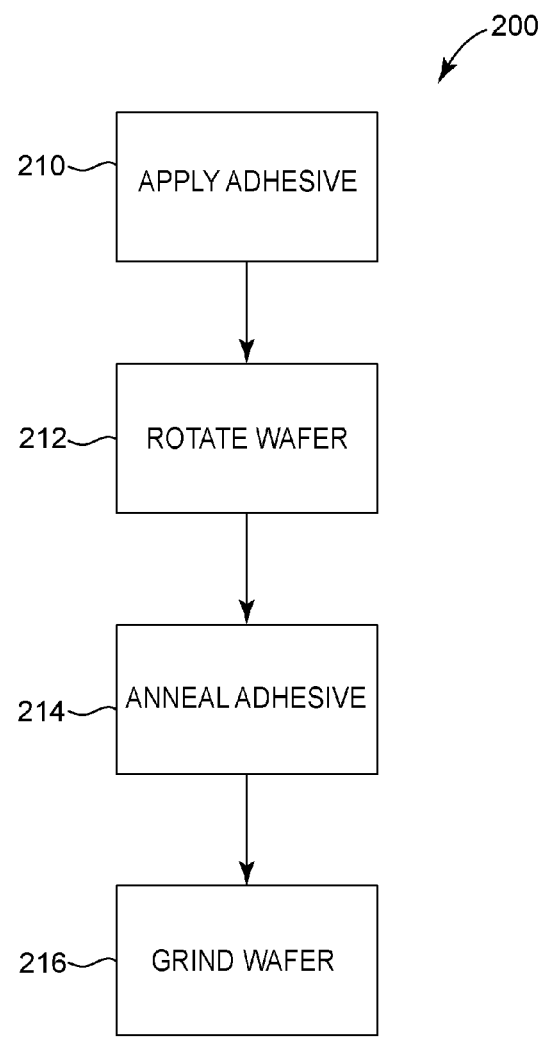
FIG. 6 is a flow diagram illustrating a process for producing a semiconductor device.

FIG. 6 illustrates an exemplary process 200 for producing a semiconductor device having the topology adjustment disclosed herein. As indicated in block 210 of FIG. 6, adhesive is applied to the portion of the first side 102 of the wafer 110 not having the active portion 112. For the exemplary device 100 illustrated in FIGS. 2-5, this portion is the edge exclusion area 120. Accordingly, a ring of adhesive is applied to this area of the wafer 110, extending around the active area 112. A suitable adhesive is Semicosil 987, available from Wacker-Chemie GmbH (www.waker.com). As noted above, the active area 112 extends a first distance D1 above the first side 102 of the wafer, and the support member 122 needs to extend above the first side 102 about an equal distance D2. To achieve the proper height D2, the tape is attached to the first side 102 of the wafer 110, such that the adhesive is situated in the edge exclusion area 120 between the first side 102 and the tape 130. The device 100 is then attached to the chuck 140. As long as the amount of adhesive initially dispensed onto the wafer 110 results in the adhesive extending above the first side 102 by at least distance D1, the height D2 of support member 122 will be the same as the distance D1 when the adhesive is compressed between the tape 130 and the first side 102 since the adhesive is in an elastic state.

The wafer 110 attached to the chuck 140 is then spun (block 212) so that excess adhesive is removed by centrifugal force. The rotation speed for spinning the wafer can vary from a few hundred rpm to about 2,000 rpm, depending on several factors, such as the size of the wafer, the type of adhesive, the height D1 of the active area 112, etc.

After applying the adhesive and spinning the wafer, the adhesive is annealed as indicated in block 214 by heating the adhesive. In one embodiment, the adhesive is heated to about 100-150° C. for about 2-3 minutes. Again, the temperature and time for curing the adhesive will vary depending on the type of adhesive used. Once the support member 122 is properly in place and cured, the second side 104 of the wafer 110 can be ground to thin the wafer to the desired dimension, indicated in block 216. The grinding can be done using a standard procedure, for example, by using chemical-mechanical planarization (CMP). With this method it is possible to thin the wafer from a wafer thickness of about 800 µm to a wafer thickness of about 100 µm or less without the wafer edge exclusion area 120 suffering from breaking or chipping.

The support member 122 thus eliminates the topology waste at the edge of the wafer 110, and thus, the cause of much wafer damage. Further, the presence of the adhesive ring in the edge exclusion area 120 typically does not disrupt subsequent measuring in the test field.

What is claimed is:

1. A semiconductor device, comprising:
   a semiconductor wafer having a first side and an opposing second side;
   an active area formed on a first portion of the first side having a topology extending a first distance above the first side; and
   a one-piece support member attached to a second portion of the first side and surrounding the first portion, the support member extending a second distance above the first side, wherein the first distance is about the same as the second distance.

2. The semiconductor device of claim 1, wherein the second portion of the first side defines an edge exclusion area about a periphery of the first side.

3. The semiconductor device of claim 1, wherein the support member comprises adhesive.

4. The semiconductor device of claim 1, further comprising an adhesive tape attached to the active area.

5. The semiconductor device of claim 4, wherein the support member is situated between the first side and the adhesive tape.

6. The semiconductor device of claim 2, wherein the support member is attached to the edge exclusion area.

7. The semiconductor device of claim 6, wherein the support member comprises a ring of adhesive attached to the edge exclusion area.

8. The semiconductor device of claim 1, wherein the wafer is generally circular.

9. The semiconductor device of claim 1, wherein the active area includes an integrated circuit.

* * * * *